(12) United States Patent
Khawshe

(10) Patent No.: US 7,265,597 B2
(45) Date of Patent: Sep. 4, 2007

(54) DIFFERENTIAL CLOCK CORRECTION

(75) Inventor: Vijay Khawshe, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 11/020,984

(22) Filed: Dec. 22, 2004

(65) Prior Publication Data
US 2006/0132207 A1 Jun. 22, 2006

(51) Int. Cl.
*H03K 3/017* (2006.01)
(52) U.S. Cl. ..................... 327/175; 327/172
(58) Field of Classification Search ......... 327/172–175
See application file for complete search history.

(56) References Cited

U.S. PATENT DOCUMENTS

| | | | | |
|---|---|---|---|---|
| 5,572,158 A * | 11/1996 | Lee et al. | ................. | 327/175 |
| 6,066,972 A * | 5/2000 | Strom | ................. | 327/175 |
| 6,411,145 B1 * | 6/2002 | Kueng et al. | ................. | 327/175 |
| 6,643,790 B1 * | 11/2003 | Yu et al. | ................. | 713/500 |
| 6,690,218 B2 * | 2/2004 | Goldblatt | ................. | 327/175 |
| 6,762,636 B1 * | 7/2004 | Khawshe | ................. | 327/175 |
| 6,819,155 B1 * | 11/2004 | Ling et al. | ................. | 327/175 |
| 6,833,743 B2 * | 12/2004 | Gu et al. | ................. | 327/175 |
| 6,933,759 B1 * | 8/2005 | Wu et al. | ................. | 327/172 |
| 6,943,604 B2 * | 9/2005 | Minzoni | ................. | 327/175 |
| 6,963,235 B2 * | 11/2005 | Lee | ................. | 327/158 |
| 7,015,739 B2 * | 3/2006 | Lee et al. | ................. | 327/175 |

* cited by examiner

*Primary Examiner*—Kenneth B. Wells
*Assistant Examiner*—Hai L. Nguyen
(74) *Attorney, Agent, or Firm*—Ram P. Yadav

(57) ABSTRACT

A method, system, and apparatus are disclosed that correct a differential clock signal. A clock correction circuit may determine a DC correction for a first clock signal of a differential clock signal and a DC correction for a second clock signal of a differential clock signal based upon a DC level of the differential clock signal. The clock correction circuit may adjust a DC level of the first clock signal based upon the DC correction for the first clock signal and a DC level of the second clock signal based upon the DC correction for the second clock signal to substantially maintain a duty cycle of the differential clock signal.

13 Claims, 3 Drawing Sheets

Clock generator

DIFFERENTIAL CLOCK CORRECTION

BACKGROUND OF THE INVENTION

Wireless transmission systems may have transceivers to modulate and demodulate signals based upon a differential clock signal. For some modulation techniques, accuracy of modulating and demodulating is dependent upon the accuracy of the differential clock signal. In particular, some modulation techniques require a differential clock signal with a 50 percent duty cycle.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION OF THE INVENTION

In the following detailed description, numerous specific details are described in order to provide a thorough understanding of the invention. However the present invention may be practiced without these specific details. In other stances, well known methods, procedures, components and circuits have not been described in detail so as not to obscure the present invention. Further, example sizes/models/values/ ranges may be given, although the present invention is not limited to these specific examples.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
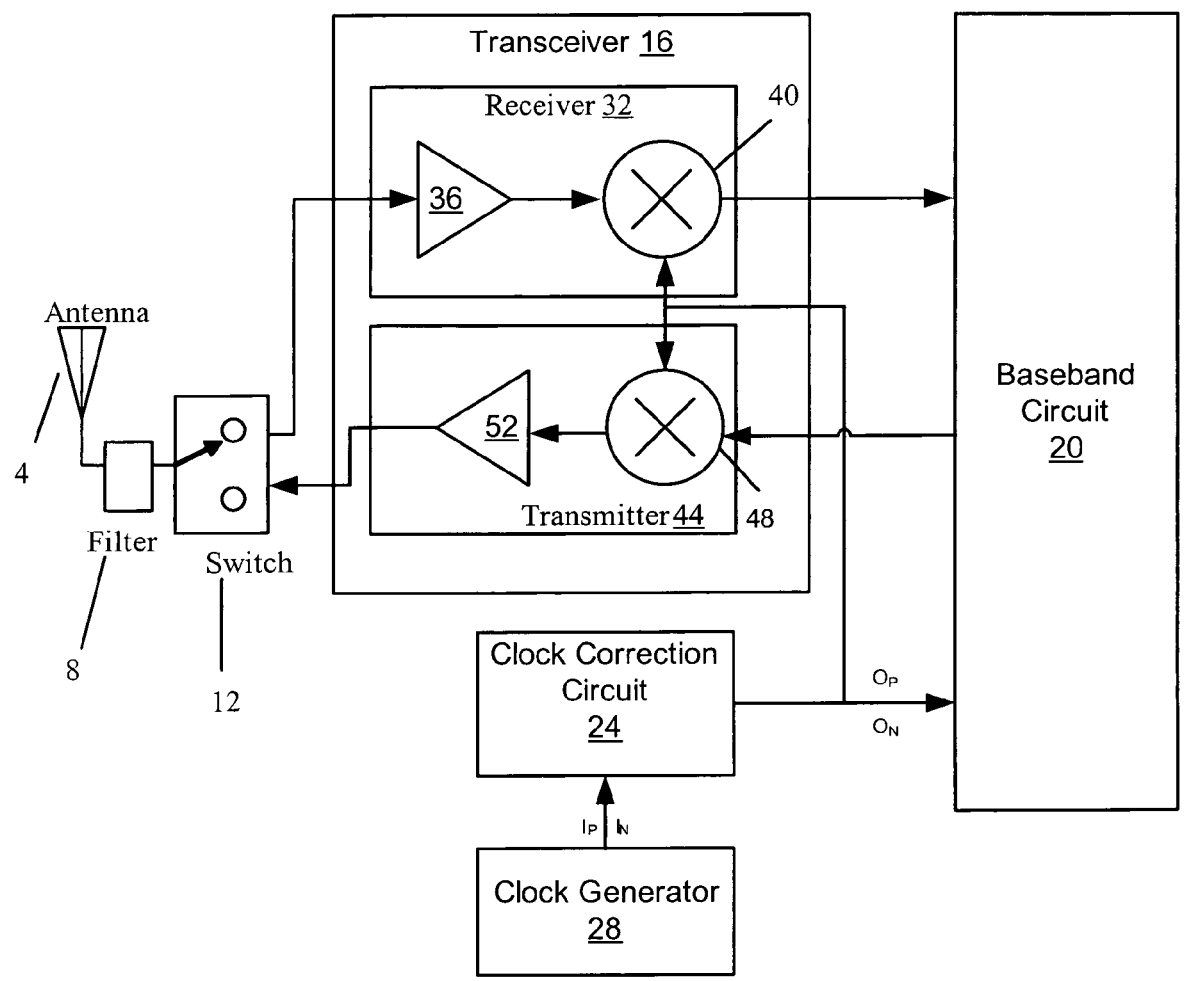
FIG. 1 illustrates an embodiment of a wireless system with a clock correction circuit.

Referring to FIG. 1 an embodiment of a wireless system is shown. The wireless system may include an antenna 4, filter 8, a switch 12, a transceiver 16, a baseband circuit 20, a clock correction circuits 24, and a clock generator 28. The antenna 4 may receive wireless modulated signals from the environment and provide the transceiver 16 with the received modulated signal via the filter 8 and the switch 12. The transceiver 16 may comprise a receiver 32 to demodulate the modulated signal and to obtain a baseband signal. To this end, the receiver 32 may comprise an amplifier 36 to amplify the modulated signal received by the antenna 4.

Further, the receiver 32 may comprise a demodulator 40 to demodulate the amplified modulated signal and provide the baseband circuit 20 with a baseband signal for further processing. In one embodiment, the demodulator 40 comprises an Orthogonal Frequency Division Multiplexing (OFDM) demodulator that demodulates the modulated signal based upon a corrected differential clock signal of the clock correction circuit 24.

The transceiver 16 may further comprise a transmitter 44 to modulate a baseband signal of the baseband circuit 20 to obtain a modulated signal that is representative of the baseband signal. To this end, the transmitter 44 may comprise a modulator 48 to modulate a baseband signal of baseband circuit 20. Further, the transmitter 44 may comprise an amplifier 52 to amplify the modulated signal of the modulator 48 and provide the amplified signal to the antenna 4 via the switch 12 and the filter 8. In one embodiment, the modulator 48 comprises an Orthogonal Frequency Division Multiplexing (OFDM) modulator that modulates the baseband signal based upon a corrected differential clock signal of the clock correction circuit 24.

The clock generator 28 may generate a differential clock signal that comprises a positive or first clock signal IP and a negative or second clock signal IN that is a mirror image of the first clock signal IP. Ideally, crossings of the first clock signal IP and the second clock signal IN define periods of equal lengths which is commonly referred to as a 50 percent duty cycle. Accuracy of certain modulation and demodulation techniques (e.g. OFDM (de)modulation) are dependent upon the ability to maintain a differential clock signal at a 50 percent duty cycle. However, variation in temperature, process, nonlinearity of devices, mismatches may result in a shift in the duty cycle of the differential clock signal IN and IP which is more pronounced when the differential clock signal operates at a small amplitudes (e.g. millivolt range). Accordingly, the clock correction circuit 24 may adjust or correct the differential clock signal of the clock generator 28 in order to obtain a corrected clock signal that substantially maintains a 50 percent duty cycle.

Figure 2:
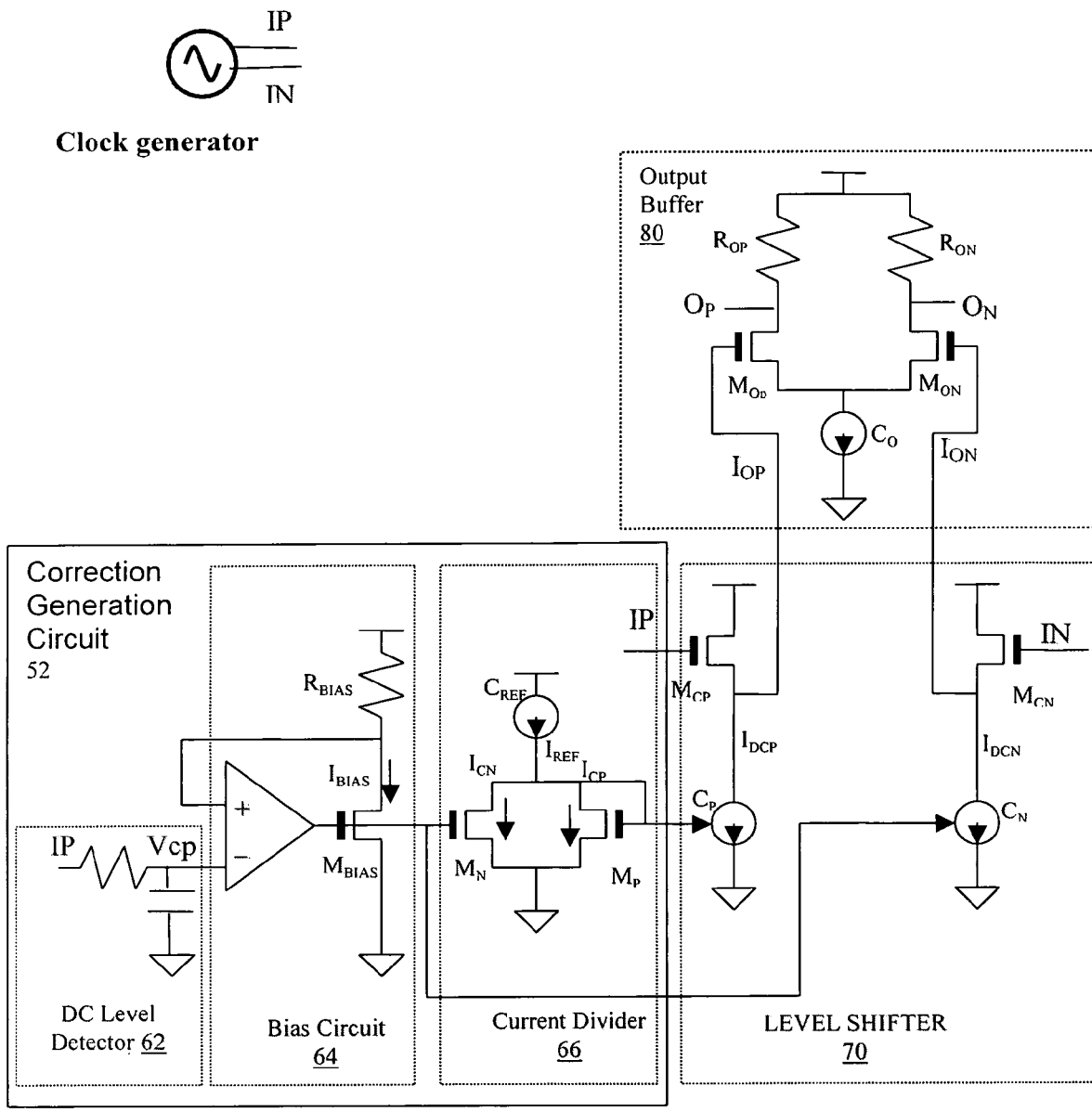
FIG. 2 illustrates an embodiment of the clock correction circuit of FIG. 1.

Referring now to FIG. 2, an embodiment of the clock correction circuit 24 is shown. The clock correction circuit 24 according to an embodiment may comprise a correction generation circuit 60. The correction generation circuit 60 may generate a correction signal $I_{CP}$ for a positive clock signal $I_P$ of the differential clock signal and a correction signal $I_{CN}$ for a negative clock signal $I_N$ of the differential clock signal. In one embodiment, the correction generation circuit 60 may comprise a direct current (DC) level detector 62, a bias circuit 64, and a current divider 66. The DC level detector 62 may generate a DC voltage Vcp that is indicative of the DC level of the positive clock signal IP of the differential clock signal. In one embodiment, the DC level detector 62 may comprise a low pass filter (e.g. a resistor and a capacitor) that filters out the AC (alternating current) portion of the positive clock signal IP and allows the DC portion of the positive clock signal IP to pass. As a result, the output of the low pass filter may comprise a DC voltage that is proportional to the DC level of the positive clock signal IP.

The bias circuit 64 may generate a bias current $I_{BIAS}$ that has a DC current level that is based upon the DC voltage Vcp of the DC level detector 62. To this end, the bias circuit 64 in one embodiment comprises an operational amplifier, a resistor $R_{BIAS}$, a transistor $M_{BIAS}$ that are connected in a classical voltage to current amp. In the depicted configuration, the operational amplifier, the resistor $R_{BIAS}$, and the transistor $M_{BIAS}$ may generate a bias current $I_{BIAS}$ that is negatively proportional to the DC voltage Vcp of the positive clock signal IP, generated by the DC level detector 62.

The current divider 66 may generate the correction signals $I_{CP}$, $I_{CN}$ for the clock signals IP, IN based upon the bias current $I_{BIAS}$ of the bias circuit 64. To this end, the current divider 66 in one embodiment may comprise a reference current source $C_{REF}$ and transistors $M_P$, $M_N$. The transistors $M_P$, $M_N$ may divide a reference current $I_{REF}$ of the reference current source $C_{REF}$ based upon the bias current $I_{BIAS}$. In particular, the transistor $M_N$ may generate a correction signal $I_{CN}$ for the negative clock signal $I_N$ that is a mirror of the bias current $I_{BIAS}$. In response to the transistor $M_N$ generating a correction signal $I_{CN}$ of $I_{BIAS}$, the transistor $M_P$ may generate a correction signal $I_{CP}$ for the positive clock signal $I_P$ that has a DC level equal to the reference current $I_{REF}$ minus the bias current $I_{CN}$. In one embodiment, the reference current source $C_{REF}$ and the bias circuit 64 are configured such that bias circuit 64 generates a bias current $I_{BIAS}$ of $I_0$ and the reference current source $C_{REF}$ generates a reference current $I_{REF}$ of $2*I_0$ when the clock signals $I_P$, $I_N$ of the differential clock signal generate a 50 percent duty cycle.

As depicted, the clock correction circuit 24 may further comprise a level shifter 70 and an output buffer 80. The level shifter 70 may shift the DC level of the clock signals $I_P$, $I_N$ based upon the corresponding correction signals $I_{CP}$, $I_{CN}$. In one embodiment, the level shifter 70 may comprise controllable current sources $C_P$, $C_N$ and transistors $M_P$, $M_N$. The current sources $C_P$, $C_N$ may generate DC correction currents $I_{DCP}$, $I_{DCN}$ that are proportional to the correction signals $I_{CP}$, $I_{CN}$. In particular, the current sources $C_P$, $C_N$ may respectively generate their DC correction currents $I_{DCP}$, $I_{DCN}$ such that they are equal to the correction signals $I_{CP}$, $I_{CN}$ times a gain factor A (e.g. 1). Furthermore, the current sources $C_P$, $C_N$ in one embodiment are matched such that the current sources $C_P$, $C_N$ generate substantially identical DC currents $I_{DCP}$, $I_{DCN}$ for substantially identical correction signals $I_{CP}$, $I_{CN}$. The transistors $M_P$, $M_N$ may respectively receive the clock signals $I_P$, $I_N$ via their gates and the correction signal $I_{CP}$, $I_{CN}$ via their sources thereby producing level shifted output currents $I_{OP}$, $I_{ON}$.

The output buffer 80 may generate a corrected clock signal $O_P$, $O_N$ based upon the shifted output currents $I_{OP}$, $I_{ON}$ of the level shifter 70. As shown, the output buffer 80 may comprise transistors $M_{OP}$, $M_{ON}$, resistors $R_{OP}$, $R_{ON}$, and a current source $C_O$ that form a current-mode logic buffer. The resistor $R_{OP}$, transistor $M_{OP}$, and current source $C_O$ may generate, based upon the shifted output current $I_{OP}$, a corrected positive clock signal $O_P$ with a DC offset of substantially zero volts. Similarly, the resister $R_{ON}$, transistor $M_{ON}$, and current source $C_O$ may generate, based upon the shifted output current $I_{ON}$, a corrected negative clock signal $O_n$ with a DC offset of substantially zero volts.

Figure 3:
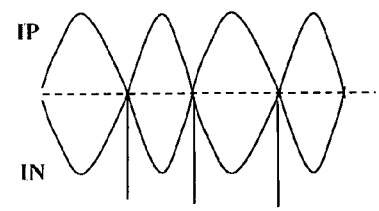
FIG. 3 illustrates correction of a differential clock signal with a duty cycle greater than 50 percent.
Figure 3:
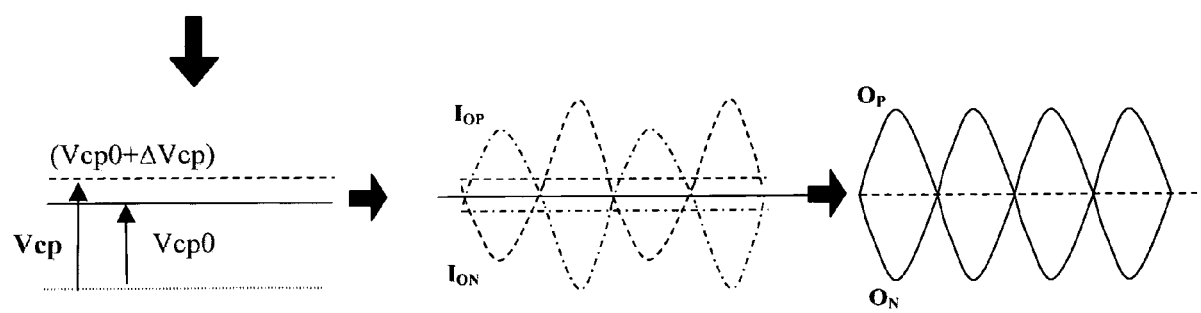

Operation of the clock correction circuit 24 when the differential clock signal has a duty cycle of more than 50 percent will now be described in regard to FIG. 3. When the differential clock signal has a duty cycle of more than 50 percent, the positive clock signal $I_P$ may have a positive DC offset. In one embodiment, the DC level detector 62 may generate a reference DC voltage Vcp0 when the differential clock signal has a 50 percent duty cycle. Therefore, the DC level detector 62 in response to the positive clock signal may generate a larger DC voltage Vcp (e.g. Vcp0+ΔVcp) than the reference DC voltage Vcp0 since the positive clock signal has a positive DC offset. In particular, the larger DC voltage Vcp may comprise the reference DC voltage Vcp0 and a DC offset ΔVcp.

The bias circuit 64 in turn may generate a smaller bias current $I_{BIAS}$ (e.g. $I_0$-ΔI) than when the differential clock signal has a 50 percent duty cycle. In particular, the bias current $I_{BIAS}$ may comprise the reference bias current $I_0$ and a bias offset ΔI that is negative and proportional to the DC offset ΔVcp. The transistor $M_N$ may generate a smaller correction signal $Ic_N$ (e.g. $I_0$-ΔI) by mirroring the smaller bias current $I_{BIAS}$. As a result of generating a smaller correction signal $Ic_N$ for the negative clock signal $I_N$, the transistor $M_P$ may generate a larger correction signal $I_{CP}$ (e.g. $I_0$+ΔI) for the positive clock signal $I_P$.

The controllable current sources $C_P$ may increase the DC correction current $I_{DCP}$ for the positive clock signal $I_P$ based upon the larger correction signals $I_{CP}$. Conversely, the controllable current sources $C_N$ may reduce the DC correction current $I_{DCN}$ for the negative clock signal based upon the smaller correction signals $I_{CN}$. In particular, the current sources $C_P$, $C_N$ may respectively generate a larger DC correction current $I_{DCP}$ (e.g. $I_0$+ΔI) and a smaller DC correction current (e.g. $I_0$-ΔI). The larger DC correction current $I_{DCP}$ effectively causes the level shifter 70 to shift the DC level of the output $I_{OP}$ downward, and the smaller DC correction current $I_{DCN}$ effectively causes the level shifter 70 to shift the DC level of the output $I_{ON}$ upward to obtain a differential clock signal having a 50 percent duty cycle at the outputs $O_P$ and $O_N$ of the output buffer 80.

Figure 4:
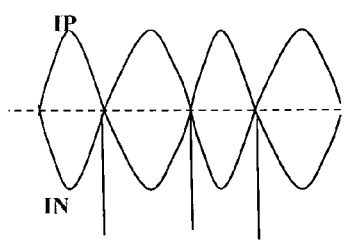
FIG. 4 illustrates correction of a differential clock signal with a duty cycle less than 50 percent.
Figure 4:
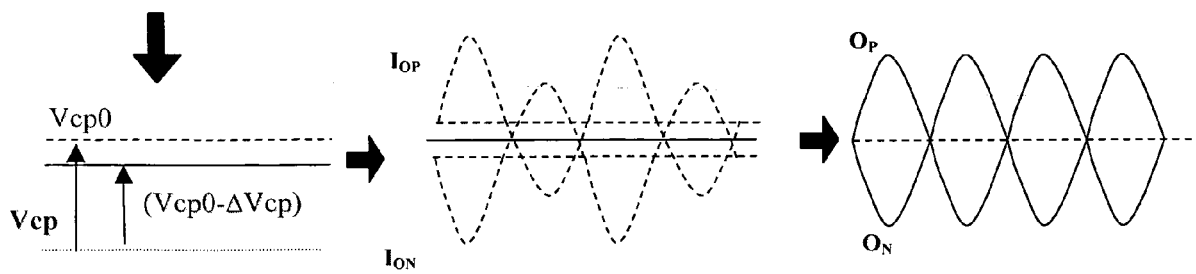

Operation of the clock correction circuit 24 when the differential clock signal has a duty cycle of less than 50 percent will now be described in regard to FIG. 4. When the differential clock signal has a duty cycle of less than 50 percent, the positive clock signal $I_P$ may have a negative DC offset. Therefore, the DC level detector 62 in response to the positive clock signal may generate a smaller DC voltage Vcp (e.g. Vcp0-ΔVcp) than the reference DC voltage Vcp0 since the positive clock signal has a negative DC offset. In particular, the smaller DC voltage Vcp may comprise the reference DC voltage Vcp0 and a negative DC offset ΔVcp.

The bias circuit 64 in turn may generate a larger bias current $I_{BIAS}$ (e.g. $I_0$+ΔI) than when the differential clock signal has a 50 percent duty cycle. In particular, the bias current $I_{BIAS}$ may comprise the reference bias current $I_0$ and a bias offset ΔI that is negatively proportional to the DC offset ΔVcp. The transistor $M_N$ may generate a larger correction signal $I_{CN}$ (e.g. $I_0$+ΔI) by mirroring the larger bias current $I_{BIAS}$. As a result of generating a larger correction signal $I_{CN}$ for the negative clock signal $I_N$, the transistor $M_P$ may generate a smaller correction signal $I_{CP}$ (e.g. $I_0$-ΔI) for the positive clock signal $I_P$.

The controllable current sources $C_P$ may decrease the DC correction current $I_{DCP}$ for the positive clock signal $I_P$ based upon the smaller correction signals $I_{CP}$. Conversely, the controllable current sources $C_N$ may increase the DC correction current $I_{DCN}$ for the negative clock signal based upon the larger correction signals $I_{CN}$. In particular, the current sources $C_P$, $C_N$ may respectively generate a smaller DC correction current $I_{DCP}$ (e.g. $I_0$-ΔI) and a larger DC correction current $I_{DCN}$ (e.g. $I_0$+ΔI). The smaller DC correction current $I_{DCP}$ effectively causes the level shifter 70 to shift the DC level of the output $I_{op}$ upward, and the larger DC correction current $I_{DCN}$ effectively causes the level shifter 70 to shift the DC level of the output $I_{ON}$ downward to obtain a differential clock signal having a 50 percent duty cycle at the outputs $O_P$ and $O_N$ of the output buffer 80.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A method comprising
   determining a DC correction for a first clock signal of a differential clock signal and a DC correction for a second clock signal of the differential clock signal based upon a DC level of the differential clock signal, and
   adjusting a DC level of the first clock signal based upon the DC correction for the first clock signal and a DC level of the second clock signal based upon the DC correction for the second clock signal to substantially maintain a duty cycle of the differential clock signal.

2. The method of claim 1 wherein adjusting substantially maintains the duty cycle of the differential clock signal at substantially a 50 per cent duty cycle.

3. The method of claim 1 wherein adjusting comprises
   increasing a DC level of the first clock signal based upon the DC correction for the first clock signal, and
   decreasing a DC level of the second clock signal based upon the DC correction for the second clock signal.

4. The method of claim 1 wherein determining comprises dividing a reference current based upon the DC level of the first clock signal to obtain a first correction signal indicative of the DC correction for the first clock signal and to obtain a second correction signal indicative of the DC correction for the second clock signal.

5. The method of claim 4 wherein adjusting comprises
   shifting the DC level of the first clock signal based upon the first correction signal, and
   shifting the DC level of the second clock signal based upon the first correction signal.

6. The method of claim 1 further comprising generating a corrected differential signal comprising a predetermined duty cycle and a predetermined AC magnitude.

7. An apparatus comprising:
   a correction generation circuit to receive a first clock signal from a differential clock signal and generate a first correction signal and to receive a second clock signal from the differential clock signal and generate a second correction signal, and
   a level shifter to adjust a duty cycle of the differential clock signal by shifting a DC level of the first clock signal based upon the first correction signal, and shifting a DC level of the second clock signal based upon the second correction signal.

8. The apparatus of claim 7 further comprising an output buffer to receive the first clock signal and the second clock signal shifted by the level shifter and to output a corrected differential clock signal having substantially the predetermined duty cycle and substantially a predetermined AC magnitude.

9. The apparatus of claim 7 wherein the correction generation circuit generates the first correction signal and the second correction signal based upon a DC level of the first clock signal.

10. The apparatus of claim 7 wherein
    the correction generation circuit comprises a low pass filter to receive the first clock signal and to generate a DC voltage indicative of a DC level of the first clock signal, and
    the correction generation circuit generates the first correction signal and the second correction signal based upon the DC voltage of the low pass filter.

11. The apparatus of claim 7 wherein the correction generation circuit divides a reference current into the first correction signal and the second correction signal based upon a DC level of the first clock signal.

12. The apparatus of claim 7 wherein the correction generation circuit comprises;
    a DC level detector to receive the first clock signal and to generate a DC voltage indicative of the DC level of the first clock signal,
    a bias circuit to generate a bias current that is based upon the DC voltage of the low pass filter, and
    a current divider to divide a reference current into the first correction signal and the second correction signal based upon the bias current.

13. The apparatus of claim 7 wherein the level shifter shifts a DC level of the first clock signal and the DC level of the second clock signal to maintain the duty cycle of the differential clock signal at a substantially 50 per cent duty cycle.

* * * * *